United States Patent
Shimada et al.

(10) Patent No.: US 7,817,705 B2
(45) Date of Patent: Oct. 19, 2010

(54) LASER LIGHT SOURCE DEVICE, OPTICAL INFORMATION RECORDING DEVICE, AND OPTICAL INFORMATION REPRODUCING DEVICE

(75) Inventors: Kenichi Shimada, Yokohama (JP); Tatsuro Ide, Kawasaki (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/043,161

(22) Filed: Mar. 6, 2008

(65) Prior Publication Data

US 2008/0225909 A1 Sep. 18, 2008

(30) Foreign Application Priority Data

Mar. 12, 2007 (JP) ............................. 2007-061197

(51) Int. Cl.
- *H01S 3/08* (2006.01)
- *H01S 3/10* (2006.01)
- *H01S 3/13* (2006.01)

(52) U.S. Cl. ..................... 372/102; 372/20; 372/29.022; 372/92; 372/98

(58) Field of Classification Search ............. 372/19–20, 372/23, 29.02, 29.022, 92, 98–99, 102, 106; 359/558, 577–589
See application file for complete search history.

(56) References Cited

U.S. PATENT DOCUMENTS

| | | | |
|---|---|---|---|
| 5,164,945 A * | 11/1992 | Long et al. | 372/6 |
| 7,161,890 B2 * | 1/2007 | Komma et al. | 369/112.07 |
| 7,397,837 B2 * | 7/2008 | Volodin et al. | 372/102 |
| 2004/0165639 A1 * | 8/2004 | Lang et al. | 372/92 |
| 2005/0226120 A1 * | 10/2005 | Nishiwaki et al. | 369/103 |
| 2006/0251131 A1 * | 11/2006 | Chong et al. | 372/6 |
| 2008/0186836 A1 * | 8/2008 | Tanaka et al. | 369/112.24 |

FOREIGN PATENT DOCUMENTS

JP 2006-114183 4/2006

* cited by examiner

*Primary Examiner*—Minsun Harvey
*Assistant Examiner*—Phillip Nguyen
(74) *Attorney, Agent, or Firm*—Antonelli, Terry, Stout & Kraus, LLP.

(57) ABSTRACT

The hologram recording technology expected to realize ultra-high-density information recording is one of the post Blu-ray Disc technology. When we think about developing a drive based on this technology and suitable for consumer electronics, it is considered most desirable from the viewpoint of upward compatibility to solve the problem of the BD-compatibility. The problem in sharing the laser light source between the hologram recording device and the current optical disc device, however, is that the hologram recording requires a high-coherent, single-mode light beam, while the current optical discs requires a low-coherent, multi-mode light beam. In point of the coherence of the light source, the above two cases require the light beams of the characteristics opposite to each other, and this presents an important task.

For the purpose of solving the above-mentioned problem, the present invention is to adopt the variable wavelength type laser light source device composed of a semiconductor laser and a diffraction grating, wherein a polarization direction converter and a polarized beam splitter are placed in the optical path between the above semiconductor laser and the above diffraction grating.

8 Claims, 8 Drawing Sheets

Spectral line width: Wide
(Coherence: Low)

Polarization direction

Spectral line width: Narrow
(Coherence: High)

Polarization direction

Spectral line width: Wide
(Coherence: Low)

Spectral line width: Narrow
(Coherence: High)

LASER LIGHT SOURCE DEVICE, OPTICAL INFORMATION RECORDING DEVICE, AND OPTICAL INFORMATION REPRODUCING DEVICE

The present application claims priority from Japanese application serial No. JP2007-061197, filed on Mar. 12, 2007, the content of which is hereby incorporated by reference into this application.

BACKGROUND

This invention relates to a laser light source device, an optical information recording device, and an optical information reproducing device.

In order to cope with the recording capacity of digital information increasing year after year, high-density optical discs are proposed to the industry, such as Blu-ray Disc (BD) Specification utilizing a disc media in combination with semi-conductor laser of 405 nm-range wavelength, high-NA objective lens with 0.85 numerical aperture (NA), and cover glass of 0.1 mm thickness, and High-Definition Digital Versatile Disc (HD-DVD) Specification utilizing a disc media in combination with semi-conductor laser of 405 nm-range wavelength, 0.65 NA, and cover glass of 0.6 mm thickness.

BD and HD DVD recorders, players and drives for PCs have already been put on the market in the expectation that these devices will become popular in the market replacing the current DVD products in the near future.

This conventional optical storage technology like BD and HD DVD has increased capacity by shortening wavelength and increasing numerical aperture of objective lens. However, when we aim to improve recording capacity further, these methods are no longer effective because wavelength is already well short and NA of objective lens is already enough large. Therefore, various research institutes have proposed several future technologies to increase recording capacity dramatically.

Among many of the future technologies, one of promising candidate is the hologram recording technology.

For example, Japanese Patent Application Laid-open Publication No. JP 2006-114183-A discloses the hologram recording technology partly.

SUMMARY

Generally, the hologram recording technology is the technology to perform recording information by overlapping signal beam and reference beam inside the recording media. Particularly, the volume hologram recording technology which the pattern of interference fringes is written three-dimensionally in the recording media has been getting attention as the technology enabling ultrahigh-density recording of information.

In the hologram recording technology, a laser light source to generate single mode and high coherence laser beam is required for making clear the pattern of interference fringes formed inside the recording media. However, low-priced, small type semiconductor laser is generally a type of multi-mode oscillation laser having a wide spectral line width, and it is difficult for even a single mode oscillation laser to keep generating a stable single mode beam under temperature fluctuation. For this reason, an expensive, large type solid-state laser has been generally used as the light source in the hologram recording technology.

On the other hand, a technology is reported to be able to generate stable, single mode laser beam by multimode oscillation laser in combination with reflection type of grating and realize tunable laser, as disclosed in the cited patent document 1.

Japanese Patent Application Laid-open Publication No JP 2006-114183-A includes descriptions concerning a Littrow type of tunable laser, the principle of which is described in the same document as follows: "The laser beam outputted from the laser diode is converted into parallel rays by a collimator lens and illuminated on the reflection type of grating. The beam diffracted by the grating is to be separated into a zero-order diffraction light and a first-order diffraction light, and the first-order diffraction light is diffracted back to the laser diode. Because of this laser beam that has thus been diffracted back to the laser diode, a resonator is composed between the diffraction grating and the laser diode, and the laser diode emits laser beam on the wavelength determined by the grating shape of the diffraction grating and the distance between the diffraction grating and the laser diode."

Incidentally, the optical information recording and reproducing device utilizing the hologram recording technology enabling recording and reproducing of ultrahigh-density information is expected also to accommodate the current optical discs such as BDs and HD-DVDs from the viewpoint of backward compatibility just as the optical disc drive for BDs and HD-DVDs does with DVDs and CDs Also, in conceiving a device that can take other discs compatible to the current optical discs, price-reduction of the device is so important factor that it is necessary to share as many kinds of optical and electrical components as possible in both the optical system accommodating hologram recording and reproducing and the optical system accommodating recording and reproducing with the current optical discs. In this connection, the semiconductor laser is one of the most expensive among the components composing the optical pick-up mounted on the current BD and HD-DVD drive. Therefore, sharing of the laser light source, if possible, can offer a great advantage in developing a device available at a low price. However, further thought given to sharing of the laser light source will find out such new problems as described below.

As mentioned above, the hologram recording technology requires a laser light source of single-mode and high coherence laser beam. To the contrary, the current optical disc system for BDs and HD-DVDs requires a laser light source of low-coherence and multimode laser beam, which is particularly necessary for the purpose of suppressing laser noise during reproduction.

The reason for the above is that in the current optical disc system, when the reflected light beam from the optical disc, etc., is incident on the semiconductor laser, the state of resonance inside the semiconductor becomes varied, thereby causing the outputted light to show changes accordingly; this phenomenon, that is, so-called laser noise caused by external feedback light gives rise to a problem. In particular, since a high-output semiconductor laser for high-speed recording has its reflectance ratio made lower at the front edge window to obtain high output, the external feedback light can easily get into the resonance section inside the laser through this window, making it easier for the laser noise to be generated.

In the current optical disc system, therefore, high frequency current is superposed on the semiconductor laser drive current by means of a high frequency superposition circuit, for example. Since the semiconductor laser has a feature of generating multimode laser beam at the start of laser oscillation, on-off operation of the laser oscillation with high frequency enables broadening of the spectral line width of the laser oscillation and turning the oscillation to the one of the multimode and lower-coherence; and thus, stable oscillation excluding the effect of the external feedback light can be realized. As mentioned in the foregoing, the hologram recording device and the current optical disc system are requiring respectively opposing characteristic in terms of coherence of the laser light source, and this is bringing up an important problem to have to be solved in regard to sharing of the laser light source.

In view of the aforementioned problem, it is most desirable if we can provide a laser light source device which, while using the same semiconductor laser light source, can be switched over from single mode to multimode or vice versa, and an optical information recording and reproducing device mounted with the aforesaid laser light source and utilizing the hologram recording technology which ensures compatibility among BDs, HD-DVDs, and any other current optical discs.

Japanese Patent Application Laid-open Publication No JP 2006-114183-A has not paid any attention to the above-mentioned problem.

It is the object of the present invention to provide a laser light source device in which the same semiconductor laser light source allows compatibility in switching-over between single mode and multimode, an optical information recording device, and an optical information reproducing device.

The above object can be achieved, for example, by the use of a diffraction grating and a polarization converter.

According to the present invention, it becomes possible to provide a laser light source device in which the same semiconductor laser light source allows compatibility in switching-over between single mode and multimode, an optical information recording device, and an optical information reproducing device.

Explanation is made below concerning the embodiments to put the present invention into practice.

BRIEF DESCRIPTION OF THE DRAWING

These and other features, objects and advantages of the present invention will become more apparent from the following description when taken in conjunction with the accompanying drawings wherein.

DETAILED DESCRIPTION OF PREFERRED EMBODIMENTS

Embodiment 1

Figure 1:
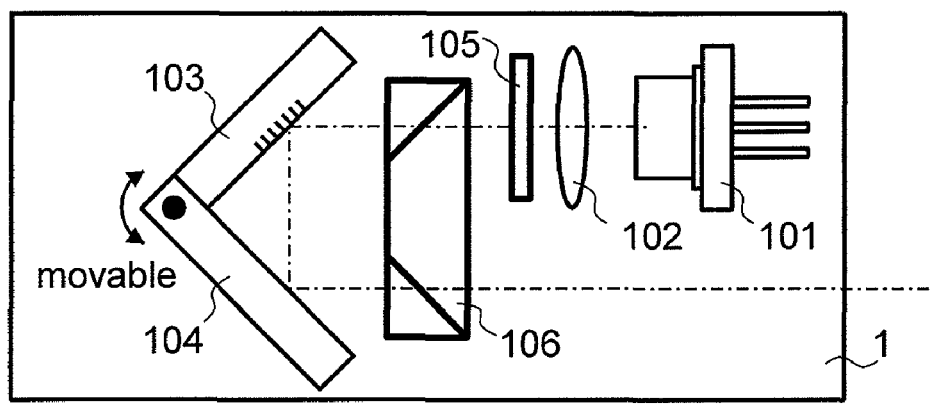
FIG. 1 is a drawing showing an embodiment of a laser light source device.
Figure 2A:
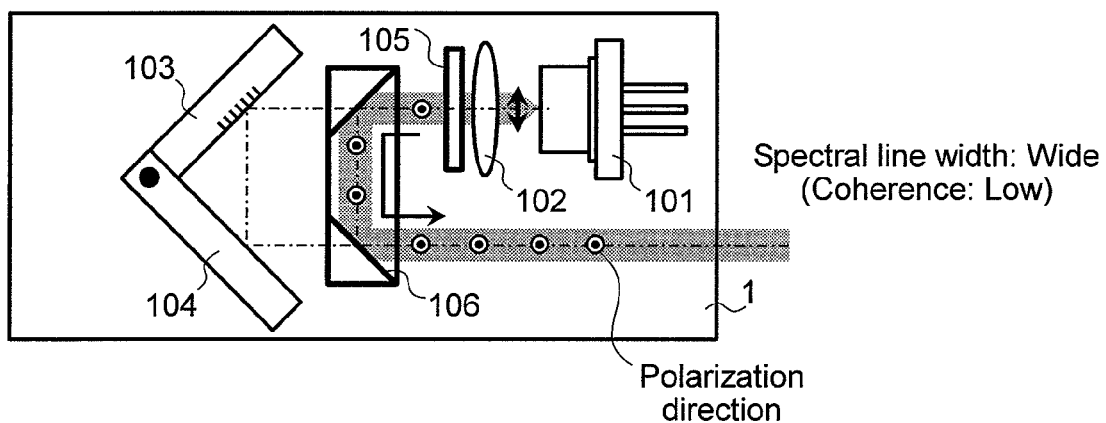
FIG. 2 is a drawing illustrating the state of propagation of light beam in the laser light source device.

FIG. 1 shows an embodiment of a laser light source device. The numeral 105 denotes the polarization converter, and the numeral 106 denotes a PBS (polarizing beam splitter) prism. Now, referring to FIG. 2, the operation of the laser light source device is explained in detail. FIG. 2(a) illustrates the state of propagation of light beam not traveling via the diffraction grating 103 inside the laser light source device 1, while FIG. 2(b) illustrates the state of propagation of light beam traveling via the diffraction grating 103 inside the laser light source device 1.

The light beam generated from the semiconductor laser 101 is converted by the collimator lens 102 into nearly parallel light beam, and incident on the polarization converter 105. In the present embodiment, for convenience sake, the polarization direction of the light beam incident on the polarization converter 105 is assumed, for example, to be a linearly-polarized light keeping parallel with the surface of the page in the drawing (the light in this state is also called as "P-polarized light" hereinafter).

To realize the state of propagation as shown in FIG. 2(a), the polarization converter 105 converts the polarization direction of the light beam from the collimator lens to a linearly-polarized light perpendicular to the surface of the page in the drawing (the light in this state is also called as "S-polarized light" hereinafter), and it is predetermined that the S-polarized light is to be incident on the PBS prism 106. The light beam, or the S-polarized light, is to be incident on the PBS prism 106 and reflected there, so as to be propagated inside the laser light source device without traveling via the diffraction grating 103 and a mirror 104.

Figure 2B:
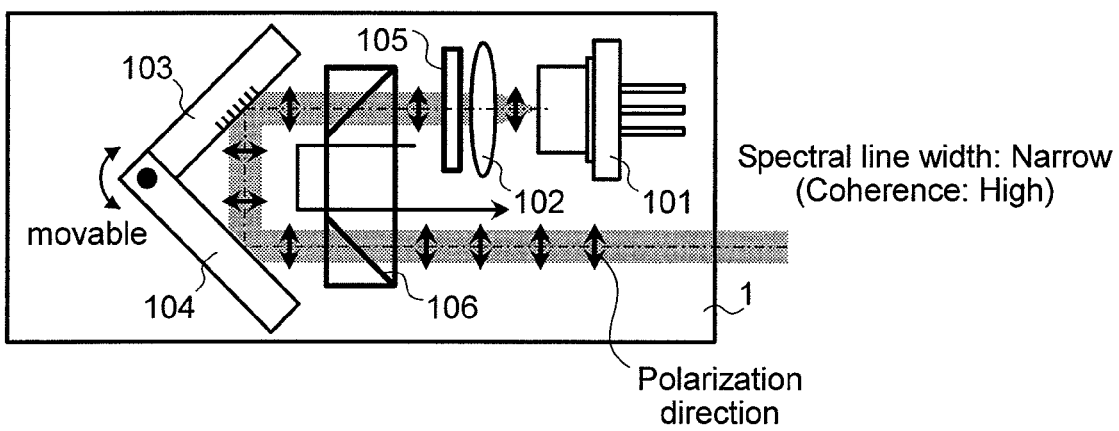

Also, to realize the state of the propagation of the light beam shown in FIG. 2(b), it is determined preliminarily that the polarization direction converter 105 is to convert the direction of polarization of the light beam from the collimator lens into linearly polarized light progressing in parallel with the surface of page so as to be incident on the PBS prism 106 as P-polarized light. The light beam incident on the PBS prism 106 as the P-polarized light is then, after being transmitted through the PBS prism 106, to be incident on the diffraction grating 103; this triggers the distance between the diffraction grating 103 and the front edge window of the semiconductor laser 101 to function as an external resonator, resulting that a single-mode laser beam with a narrow spectral width is to be outputted from the laser light source device 1. In concrete terms, the light beam outputted from the semiconductor laser 101 is converted by the collimator lens 102 into parallel beam and, via the polarization converter 105, is to be irradiated on the diffraction grating 103. The beam reflected by the diffraction grating is to be separated into zero-order diffraction light and first-order diffraction light; the first-order diffraction light traces back the same optical path it has come, to the origin, viz., the semiconductor laser 101. With this feedback light beam, a resonator is to be composed of the diffraction grating 103 and the semiconductor laser 101, inducing the light beam to be generated on the wavelength determined by the shape of the diffraction grating 103 and the distance between the diffraction grating 103 and the semiconductor laser 101. By newly adding the polarization converter 105 and the PBS prism 106 and further setting up preliminarily the polarization converter 105 as desired in the above manner, it becomes possible to control the light beam to propagate either via or not via the diffraction grating 103. In case propagation is made via the diffraction grating 103, the spectral line width of the light beam generated from the laser light source 1 can be made narrow. In case of FIG. 2(a) in which the light beam does not travel via diffraction grating 103, it is also possible to provide separately, for example, a high frequency superposition circuit, by which set-up can be made so as to positively widen the spectral line width to generate a multimode laser beam. In this manner, the present embodiment facilitates change-over to either single mode or multimode laser beam.

The polarization converter 105 may take any form, insofar as it can control polarization direction of the incident light beam. For example, it can be an element composed of a ½ wavelength plate. In this case, control of polarization direction can be carried out by rotating, or by taking-out and putting-in, the ½ wavelength plate, which constitution may be said to be less expensive as compared with the use of a liquid crystal as explained afterward. The polarization converter 105 can be as well composed of a liquid crystal element. By regulating the voltage to drive the liquid crystal, the polarization direction of the light beam outputted can be controlled, and the device using liquid crystal can be made more compact than the one using the above-mentioned ½ wavelength plate.

Embodiment 2

The layout of the polarization converter and the PBS prism inside the laser light source device is not limited to what is shown in FIG. 2 but may be arranged in any other way without departing from the spirit and scope of the invention. The layout in FIG. 3 is an example as such.

Figure 3A:
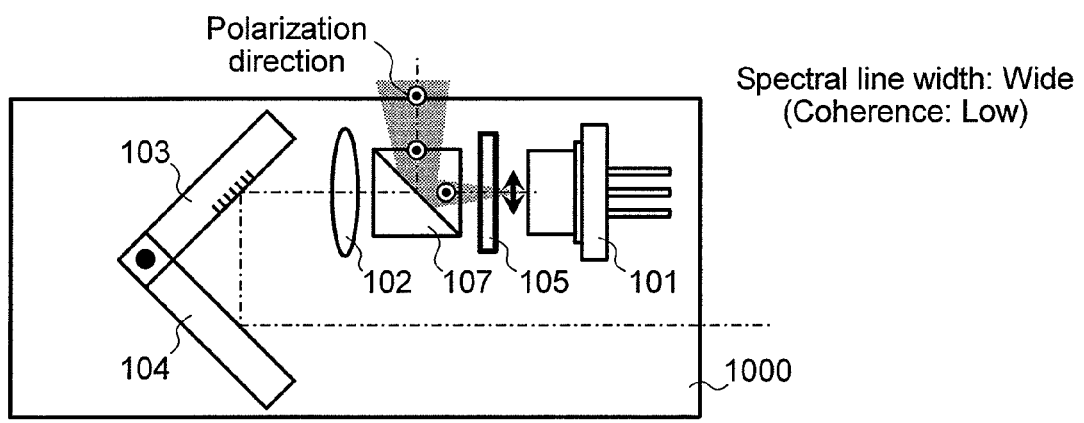
FIG. 3 is a drawing illustrating the state of propagation of light beam in the laser light source device.
Figure 3B:
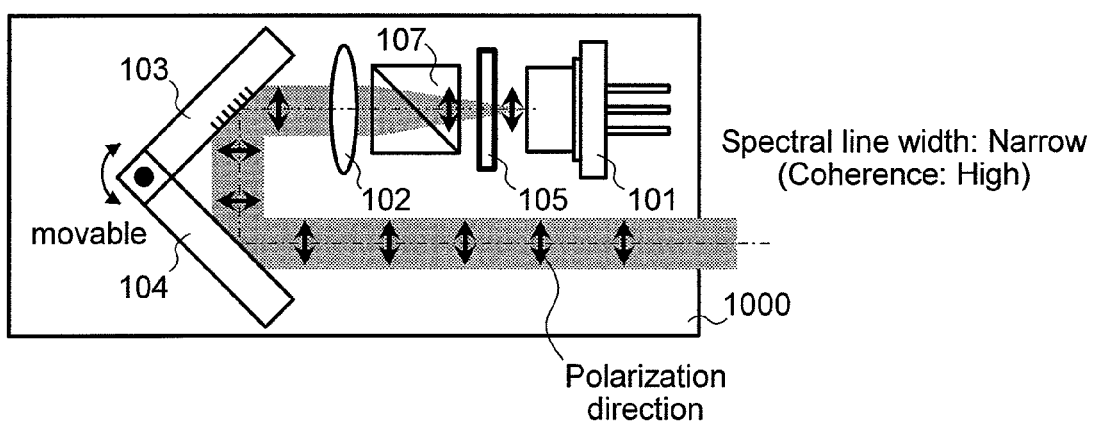

In FIG. 3, the polarization converter 105 and the PBS prism 107 are placed in the optical path between the semiconductor laser 101 and the collimator lens 102. The change over between the state of propagation of the light beam not traveling via the diffraction grating 103 inside the laser light source device as shown in FIG. 3(a) and the state of propagation of the light beam via the diffraction grating 103 inside the laser light source device as shown in FIG. 3(b) is based on the same principle explained already in relation to FIG. 2, and therefore, any further explanation is omitted. Anyway, according to the layout in FIG. 3, the present embodiment has made it possible to make the size of the PBS prism smaller than in the case of FIG. 2.

As described in above, adopting either the embodiment 1 or the embodiment 2 will be able to realize a laser light source device that facilitates changeover between single mode and multimode in regard to the state of oscillation of the light beam outputted.

Embodiment 3

Figure 4A:
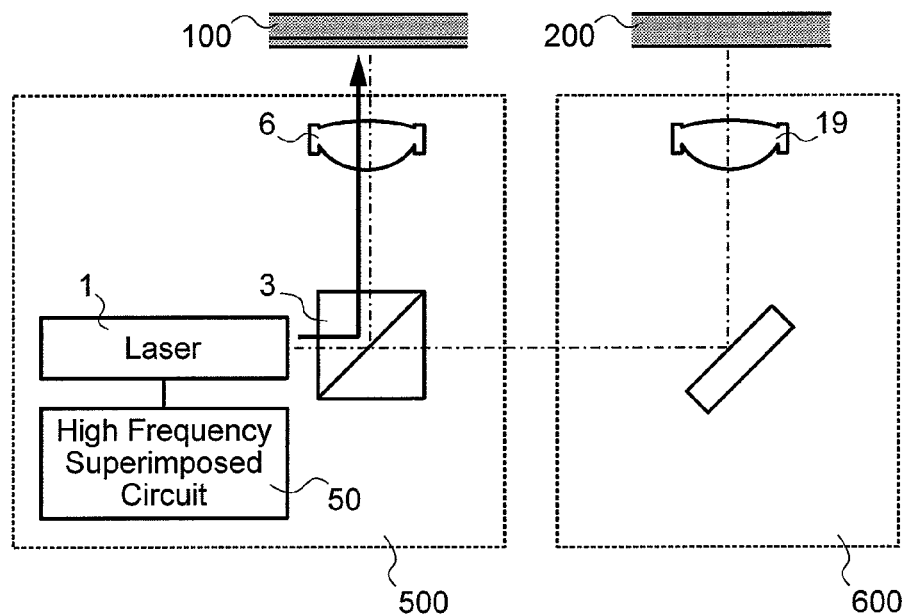
FIG. 4 is a drawing showing an optical information recording device and an optical information reproducing device.
Figure 4B:
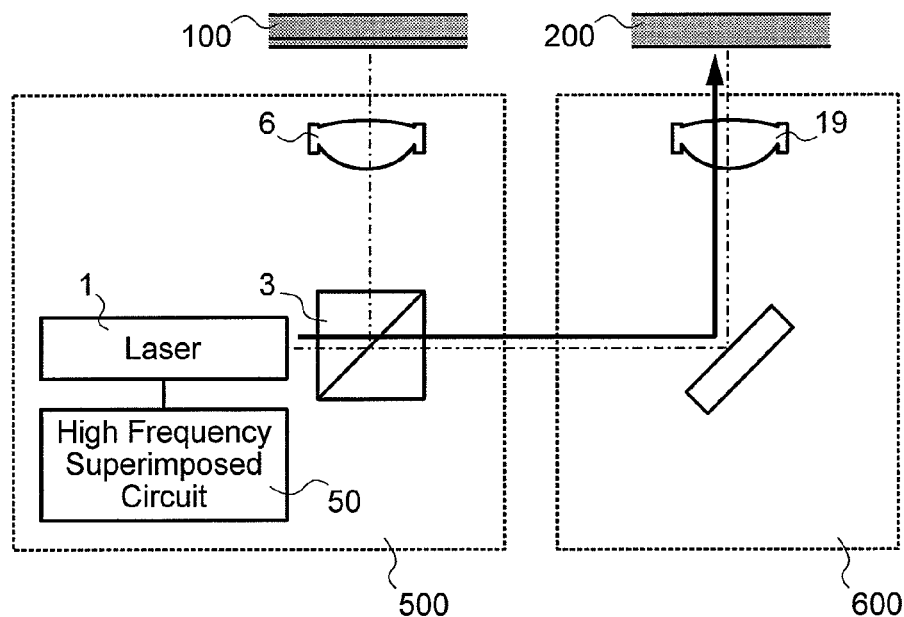

FIG. 4 is a schematic diagram of the optical information recording device and the optical information reproducing device according to the present embodiment. In FIG. 4, the numeral 100 denotes Blu-ray disc, for example, as a representative of the current optical discs, and the numeral 200 denotes a recording media corresponding to the hologram recording. The numeral 1 in the drawing denotes the laser light source device configured, for example, according to the embodiment 1. As explained above, the optical path for propagation of the light beam inside the laser light source device 1 can be switched over by means of the polarization converter placed in the laser light source device 1. As shown in FIG. 2, the polarization direction of the single-mode light beam coming via the diffraction grating 103 and that of the light beam outputted from the laser light source device without coming via the diffraction grating 103 are orthogonal to each other. Therefore, by placing the PBS prism 3 immediately after the laser light source device 1 as shown for example in FIG. 4, it is possible to easily change over from the optical path proceeding toward the current optical disc 100 as indicated in FIG. 4(a) to the optical path proceeding to the recording media 200 corresponding to the hologram recording as indicated in FIG. 4(b), or vice versa.

Also as referred to in FIG. 4, it is possible to provide the high frequency overlapping circuit 50 separately so that the spectral line width of the light beam outputted from the laser light source device but not via the diffraction grating 103 may be broadened sufficiently.

Even though the laser light source is shared, adoption of the above configuration allows it to use the multimode light beam with a broadened spectral line width under the current optical disc system 100 wherein there is a particular necessity of suppressing laser noise during reproduction; and at the time of hologram recording, it is also possible to use the single-mode light beam under the hologram optical system wherein particularly sharp image is required in respect of the pattern of interference fringes formed inside the recording media.

Figure 5:
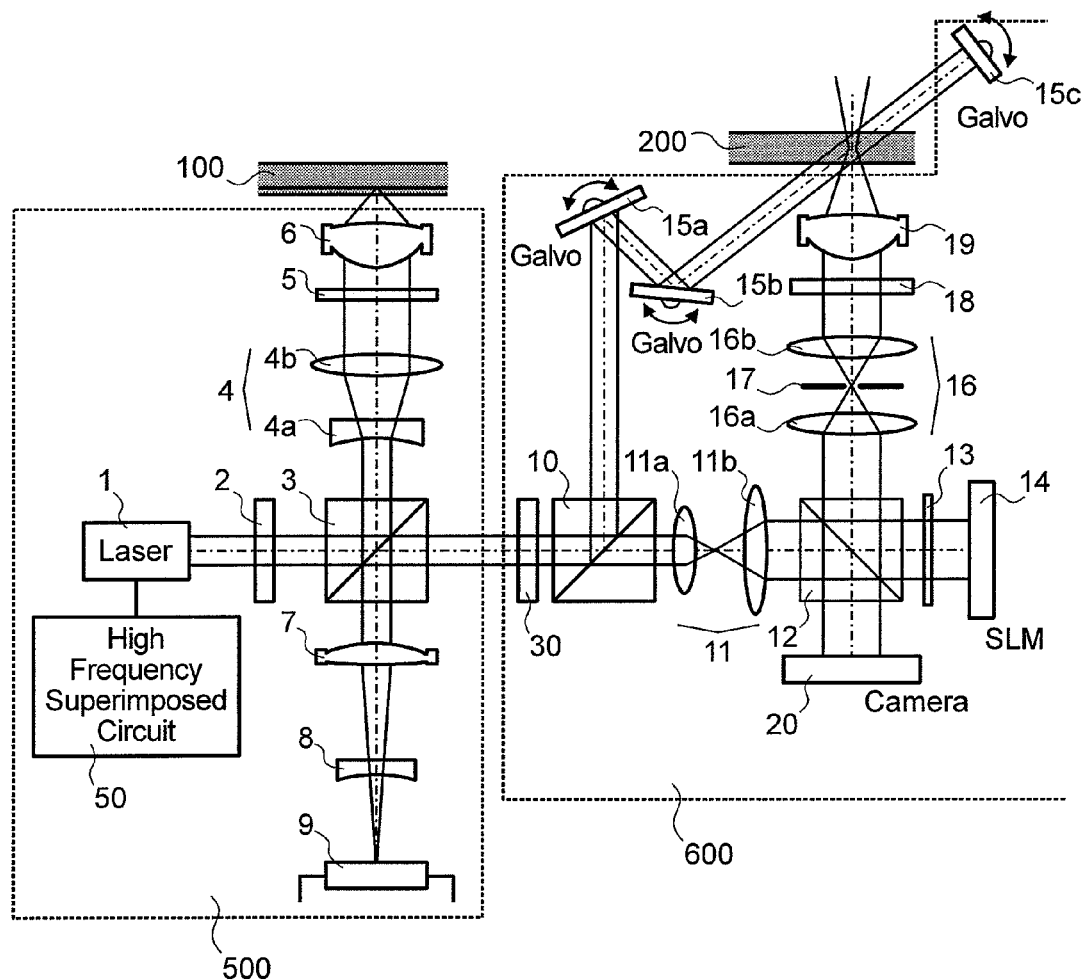
FIG. 5 is a drawing showing an optical information recording device and an optical information reproducing device.

In this connection, FIG. 5 is intended to show the optical information recording device and the optical information reproducing device explained above in reference to FIG. 4, more concretely here. The numeral 500 in the drawing denotes the optical system corresponding to the current optical disc 100, such as BD, and the numeral 600 denotes the optical system corresponding to the hologram recording.

The present embodiment is characterized in that the optical system 500 and the optical system 600 share the laser light source 1. Also, since the present embodiment is provided with the high frequency overlapping circuit by which high frequency current is made to overlap the semiconductor laser drive current, it becomes possible to keep the spectral line width of the light beam outputted from the semiconductor laser sufficiently broad by exercising high frequency overlapping depending on applications.

In case of reproducing BD, for example, the high frequency overlapping circuit is operated so as to turn the oscillation mode of the semiconductor laser inside the laser light source device 1 into multimode. Also, the polarization converter in the laser light source device 1 controls polarization direction so that the light beam outputted from the semiconductor laser may not go via the diffraction grating in the laser light source device 1 but may be outputted in multimode from the laser light source device 1.

The multimode light beam outputted from the laser light source device 1 is diffracted into three beams by means of the three-beam forming diffraction grating 2 before being incident on the PBS prism 3. As FIG. 2(a) shows, the polarization direction of the light beam outputted without going via the diffraction grating 103 in the laser light source device 1 is a linear polarization running perpendicular to the surface of the page in the drawing. This S-polarized light is to be incident on the PBS prism 3.

The light beam reflected at the PBS prism 3 passes through the beam expander 4 composed of the concave lens 4a and the convex lens 4b and, by the function of the ¼ wavelength plate 5, becomes a circularly polarized light, which is then collected in the optical disc 100 by means of the objective lens 6.

The light beam reflected at the optical disc 100 takes back the same optical path it has come, propagating in the opposite direction, and passing through the objective lens 6, the ¼ wavelength plate 5, and the beam expander 4, before being incident as P-polarized light on the PBS prism 3.

The light beam which has passed through the PBS prism 3 is turned into a convergent light by the collimator lens 7, added with astigmatism from which focus error signal is detectable by a detection lens 8 under the astigmatism method, and collected at the photodetector 9.

In the case of the hologram recording, the high frequency overlapping circuit is to be deactivated and the polarization converter is to be set preliminarily so that the light beam outputted from the semiconductor laser may run via the diffraction grating in the laser light source device 1 to become the single-mode light beam.

The single-mode laser beam generated from the laser light source device 1 moves through the three-beam forming diffraction grating 2 to be incident on the PBS prism 3. In this regard, the polarization direction of the light beam outputted via the diffraction grating inside the laser light source device 1 as shown in FIG. 2(b) is a linear polarized light in parallel with the surface of the page in the drawing. Therefore, the single-mode laser beam outputted from the laser light source device 1 is to be incident as P-polarized light on the three-beam forming diffraction grating 2 and the PBS prism 3. Since diffraction separation at the diffraction grating 2, in the case of hologram recording, is not necessarily required, the diffraction grating 2 may be used as a polarizing diffraction grating without carrying out diffraction separation of P-polarized light.

The light beam that has come through the PBS prism 3 is to be controlled by the optical element 30 composed of a ½ wavelength plate, etc., in respect to the polarization direction so that the light quantity ratio of P-polarized light to S-polarized light may become as desired ratio at both the times of recording and reproducing, before the light beam is to be incident on the PBS prism 10. At the time of reproducing, for instance, signal light beam is not needed, and therefore, the polarization direction of the light beam that has just gone through the PBS prism 3 can be changed by the optical element 30, thereby making P-polarized light larger in light quantity than S-polarized light with the result that the reference light can be irradiated onto the hologram recording media 200 with improved efficiency.

On the PBS prism 10, P-polarized light and S-polarized light can be incident at a desire ratios of light quantity, but the light beam that has come through the PBS prism 3 has been enlarged in diameter of the light beam by means of the beam expander 11 composed of the lens 11a and the lens 11b. The light beam is then incident on the spatial light modulator 14, after being transmitted via the PBS prism 12 and the ¼ wavelength plate 13.

After provided with additional information by the spatial light modulator 14, the signal light beam is to go via the ¼ wavelength plate 13, to be reflected at the PBS prism 12, and further to be propagated through the lens 16 composed of the lens 16a and the lens 16b, and the spatial filter 17. After transmitted through the relay lens 16, the signal light beam further advances through the wavelength plate 18 until to be collected by the objective lens 19 in the hologram recording media 200.

On the other hand, the light beam reflected at the PBS prism 10 functions as the reference light beam, which can be made incident on the hologram recording media 200 at a desired angle and in a desired place by properly controlling the angles of the galvano-mirror 15a and the galvano-mirror 15b.

The signal light beam and the reference light beam are superimposed upon each other in the above manner, and by writing to the recording media the patterns of the interference fringes formed out of such superimposition, it becomes possible to keep a record of information. Such configuration as indicated in the present embodiment enables realization of the recording and reproducing device in which sharing of the laser light source device is made possible and hologram is made compatible with BDs and other current optical discs.

Embodiment 4

Figure 6:
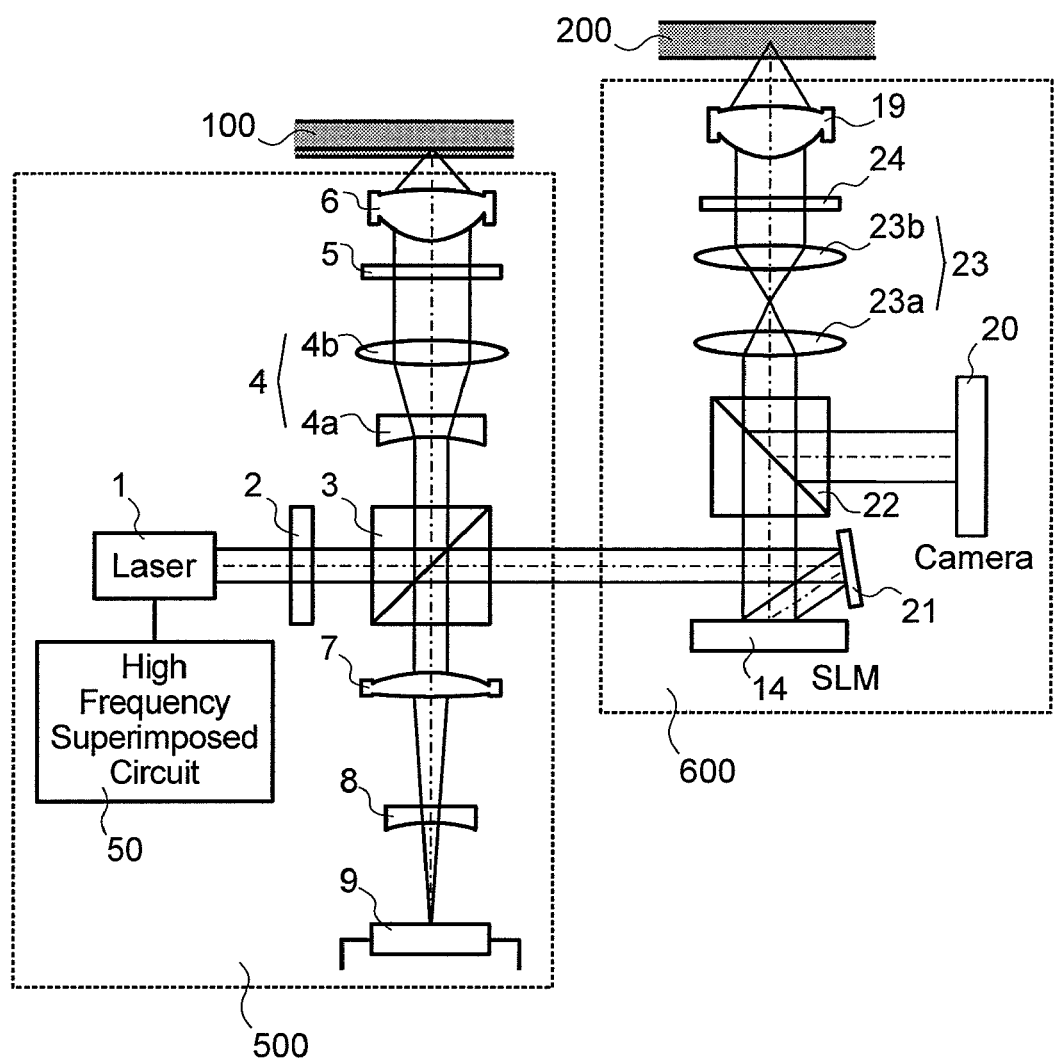
FIG. 6 is a drawing showing an optical information recording device and an optical information reproducing device.

The hologram recording and reproducing device according to the present embodiment is not limited to what is shown in FIG. 5. The optical system 600 corresponding to the hologram recording as shown in FIG. 6 may as well be configured as the optical system in which both the signal light and the reference light are dealt in a coaxial system.

Brief explanation is made here concerning the propagation of light beam in case the hologram recording is exercised. The single-mode light beam outputted from the laser light source device 1 is reflected at the reflecting mirror 21, separated at the spatial light modulator 14 into the reference light beam and the signal light beam, the latter being provided with additional information, and then transmitted through the PBS prism 22. The light beam transmitted through the PBS prism 22 is further transmitted through the relay lens 23 composed of the lens 23a and the lens 23b, and the ¼ wavelength plate, and then, by the objective lens 19, collected in the recording media 200.

In the above manner, the signal light beam and the reference light beam are incident coaxially upon the recording media 200 where the two are superimposed upon each other inside the recording media 200. By writing to the recording media the patterns of the interference fringes formed out of such superimposition, it becomes possible to keep a record of information.

Reproduction of BDs according to the present embodiment can be carried out in a similar way as described for the embodiment 3, and therefore, detailed explanation is omitted here.

Such configuration as indicated in the present embodiment, as in the case of the embodiment 3, enables realization of the recording and reproducing device in which sharing of the laser light source device is made possible and hologram is made compatible with BDs and other current optical discs.

Embodiment 5

Figure 7:
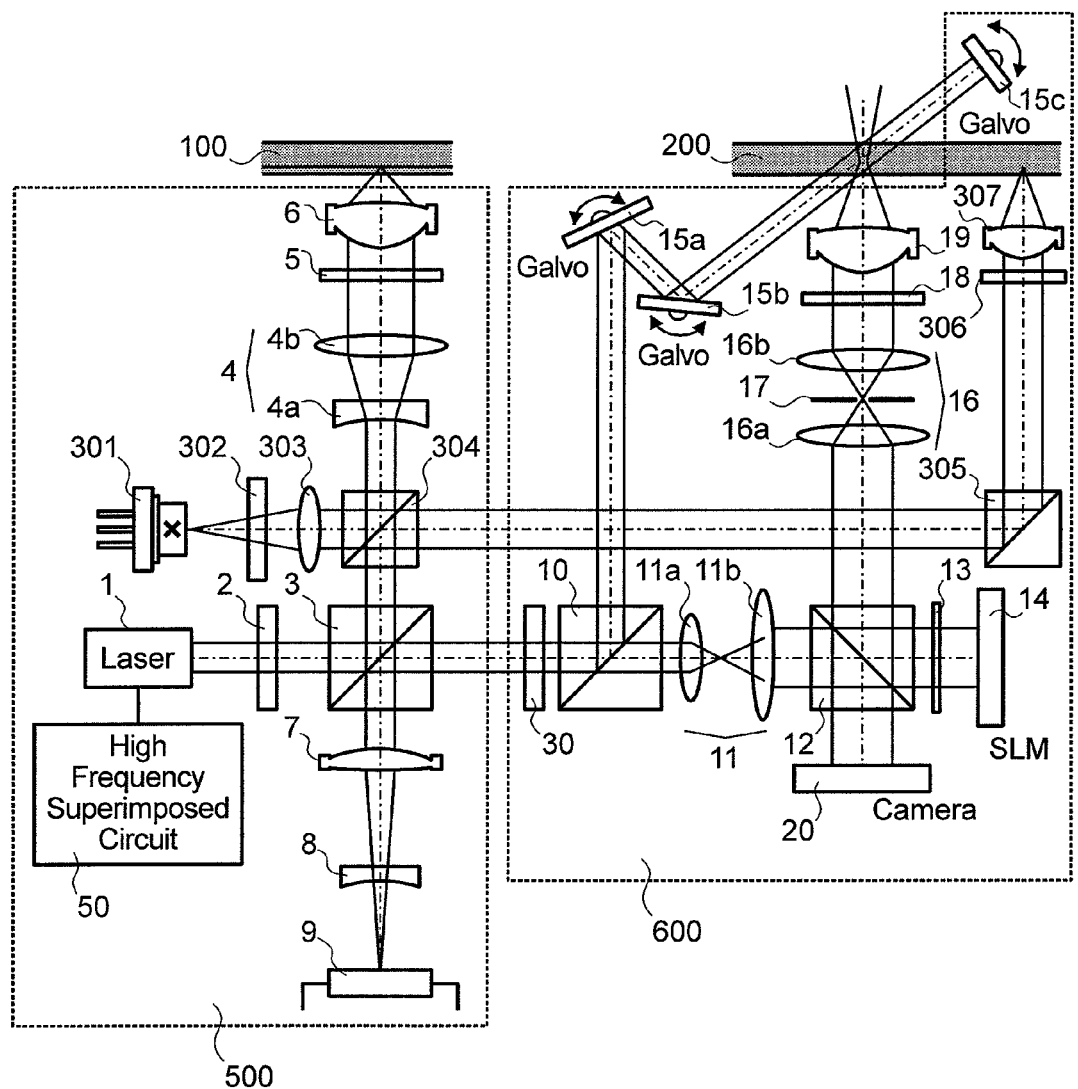
FIG. 7 is a drawing showing an optical information recording device and an optical information reproducing device.
Figure 8:
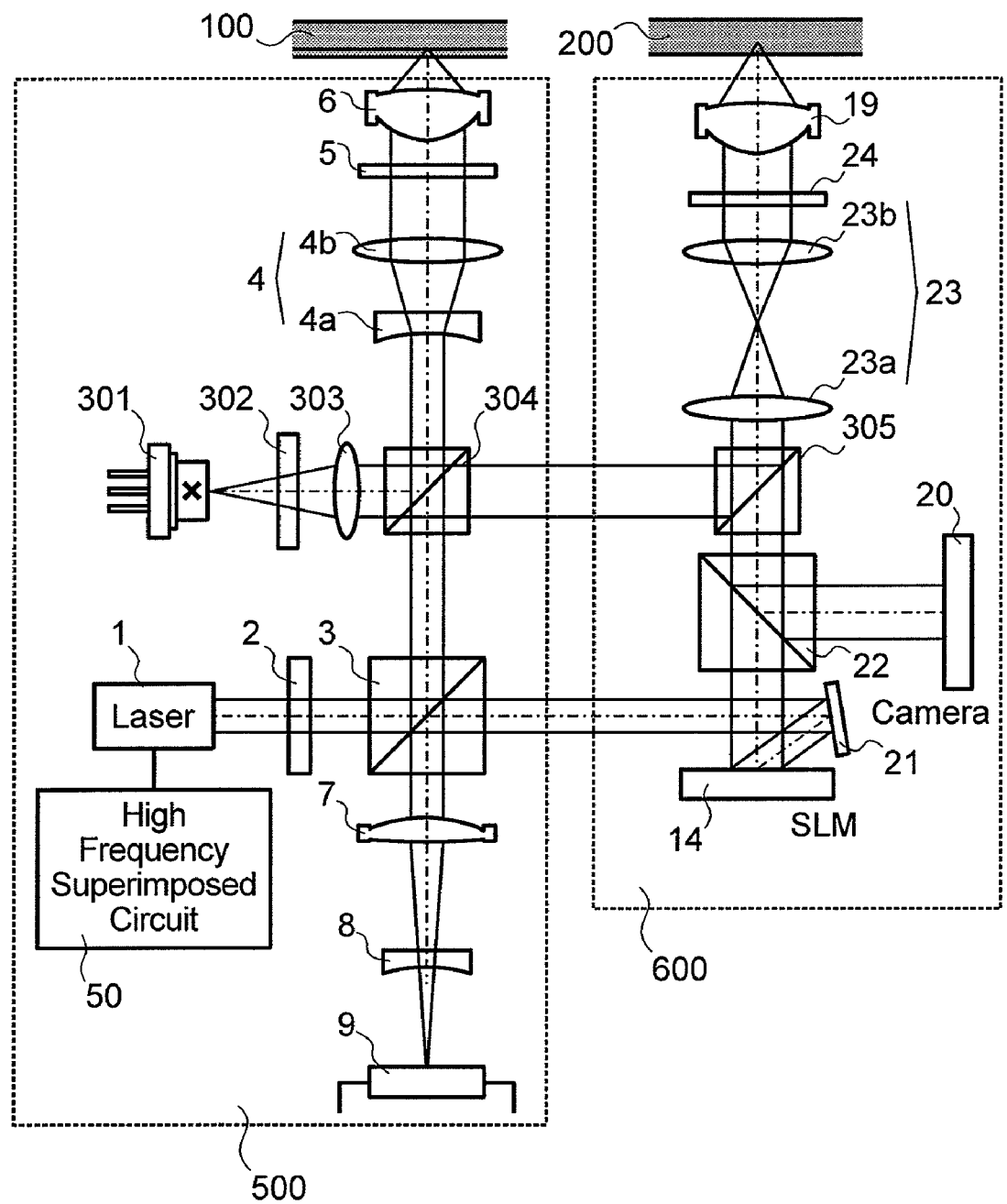
FIG. 8 is a drawing showing an optical information recording device and an optical information reproducing device.

Configuration of the hologram recording and reproducing device according to the present embodiment may well be equipped with another semiconductor laser 301 as shown in FIG. 7 and FIG. 8 in addition to the semiconductor laser in the laser light source device 1. By such employment of another light source, the light beam available therefrom can be used for such purposes as control of the hologram recording or reproducing positions when the hologram recording or reproducing is performed on the hologram recording media 200, or detection of servo signal to control tilting of the hologram recording media 200. Furthermore, the light beam outputted from the semiconductor laser 301 and heading for the optical disc 100 can be utilized as a light beam for recording and reproducing of DVDs, etc., (which may be called collectively as a third recording media).

According to such configuration as in the present embodiment, it is possible to realize a device accommodating a variety of compact discs. The present embodiment has been described on the premise that the semiconductor laser for BDs and the one for DVDs, etc., are provided separately, but this does not preclude the use of one semiconductor laser to cover recording and reproducing of BDs, DVDs, etc., in the above embodiments up to 4.

While we have shown and described several embodiments in accordance with our invention, it should be understood that disclosed embodiments are susceptible of changes and modifications without departing from the scope of the invention. Therefore, we do not intend to be bound by the details shown and described herein but intend to cover all such changes and modifications that fall within the ambit of the appended claims.

What is claimed is:

1. A laser light source device, comprising:
   a semiconductor laser,
   a controllable polarization converter configured to selectively change a polarization direction of a light beam generated from the semiconductor laser;
   a beam splitter which transmits or reflects the light beam which passes through the controllable polarization converter based on the selected polarization direction and
   a diffraction grating to diffract the light beam which passes through the beam splitter;
   wherein the diffraction grating functions as an external cavity for the laser light source device and the laser light source device is capable of generating both single mode laser beam with optical feedback from the diffraction grating, and multimode laser beam.

2. A tunable type of laser light source device, comprising:
   a semiconductor laser;
   a diffraction grating which functions as an external cavity for the tunable type laser light source device;
   a controllable polarization converter configured to selectively change a polarization direction of a light beam generated from the semiconductor laser; and
   a polarized beam splitter,
   wherein the controllable polarization converter and the polarized beam splitter are placed in the optical path between the semiconductor laser and the diffraction grating,
   wherein the polarization direction selected by the polarization converter causes the light beam to be transmitted or reflected by the polarized beam splitter, and
   wherein the laser light source device is capable of generating both single mode laser beam with optical feedback from the diffraction grating, and a multimode laser beam.

3. The laser light source device according to claim 2, wherein:
   the controllable polarization converter is placed in the optical path between the semiconductor laser and the polarized beam splitter; and by controlling the polarization direction of the light beam incident on the polarized beam splitter with the controllable polarization converter, the light beam propagation path in the device is changed into either one propagation path that the light beam is incident on the diffraction grating or another propagation path that the light beam is not incident on the diffraction grating.

4. The laser light source device according to claim 3, wherein the controllable polarization converter is composed of liquid crystal elements.

5. The laser light source device according to claim 3, wherein the controllable polarization converter is composed of a half-wavelength plate.

6. An optical information recording device and an optical information reproducing device, comprising:
   the laser light source device according to claim 1,
   a first objective lens to focus on a first recording media the light beam outputted from the laser light source device via the diffraction grating,
   a second objective lens to focus on a second recording media the light beam outputted from the laser light source device but not via the diffraction grating, and
   a high frequency superposition circuit to superpose high frequency current on the operation current of the semiconductor laser in the laser light source device.

7. The optical information recording device and the optical information reproducing device according to claim 6, wherein:
   when the light beam is focused on the first recording media, the single-mode laser beam is outputted from the laser light source device via the diffraction grating, and
   when the light beam is focused on the second recording media, the multimode laser beam is outputted from the laser light source device but not via the diffraction grating.

8. The optical information recording device and the optical information reproducing device according to claim 7, wherein:
   the devices have a second semiconductor laser which is different from the semiconductor laser in the laser light source device;
   the light beam generated from the second semiconductor laser travels through the optical path proceeding to the first recording media or the optical path proceeding to the second recording media;
   the light beam generated from the second semiconductor laser and traveling through the optical path proceeding to the first recording media is to be used as a light beam to detect servo signal for servo control when to have information recorded to or reproduced from the first recording media; and
   the light beam generated from the second semiconductor laser and traveling through the optical path proceeding to the second recording media is to be used as a light beam to have information recorded to or reproduced from a third recording media which has a cover layer different from that of the second recording media.

* * * * *